United States Patent [19]
Salmonson et al.

[11] Patent Number: 5,768,104
[45] Date of Patent: Jun. 16, 1998

[54] COOLING APPROACH FOR HIGH POWER INTEGRATED CIRCUITS MOUNTED ON PRINTED CIRCUIT BOARDS

[75] Inventors: Richard B. Salmonson, Chippewa Falls; Daniel John Dravis, Eau Claire, both of Wis.

[73] Assignee: Cray Research, Inc., Eagan, Minn.

[21] Appl. No.: 605,355

[22] Filed: Feb. 22, 1996

[51] Int. Cl.$^6$ ............................................. H05K 7/20
[52] U.S. Cl. .................... 361/704; 29/593; 257/714; 361/719
[58] Field of Search .................... 29/592.1, 593, 29/729, 739, 740; 361/699, 702, 704, 707, 717–719, 784, 785, 790; 257/712–714; 174/16.3, 252; 62/259.2; 165/80.4, 185, 104.33; 73/1 D, 15, 4 R, 497, 862.61

[56] References Cited

U.S. PATENT DOCUMENTS

| | | | |
|---|---|---|---|
| 4,324,104 | 4/1982 | Horn | 62/77 |
| 4,381,032 | 4/1983 | Cutchaw | 165/46 |
| 5,014,904 | 5/1991 | Morton | 228/176 |
| 5,119,759 | 6/1992 | Hicks | 118/712 |
| 5,311,060 | 5/1994 | Rostoker | 257/796 |
| 5,325,265 | 6/1994 | Turlik | 361/702 |

FOREIGN PATENT DOCUMENTS

| 1128496 | 5/1989 | Japan | 361/702 |
|---|---|---|---|

*Primary Examiner*—Gerald P. Tolin
*Attorney, Agent, or Firm*—Schwegman, Lundberg, Woessner & Kluth, P.A.

[57] ABSTRACT

A method and apparatus for cooling high power integrated circuits mounted on a printed circuit board. The invention includes producing a cold plate adapted to receive the printed circuit board thereon. A series of thermal shims are produced in incremental varying thicknesses from a thermally conductive material. A gap between each integrated circuit and the cold plate is determined that would result when the plate and board are assembled. One of the thermal shims is selected for each gap, the thickness of each selected shim being dependent upon the gap for which it is selected. The shim is placed between the cold plate and the integrated circuit so that when the module is assembled, the gap is eliminated and a thermal conductive path between the cold plate and each circuit is created.

8 Claims, 7 Drawing Sheets

COOLING APPROACH FOR HIGH POWER INTEGRATED CIRCUITS MOUNTED ON PRINTED CIRCUIT BOARDS

STATEMENT REGARDING GOVERNMENT RIGHTS

The present invention was made with government support under MDA 972-95-3-0032, awarded by ARPA. The Government has certain rights in this invention.

FIELD OF THE INVENTION

The present invention relates to computer printed circuit boards and more specifically to a method and apparatus for adequately cooling high power integrated circuits mounted on a printed circuit board.

BACKGROUND OF THE INVENTION

High speed electronic digital computers of the type produced by Cray Research, Inc., the assignee hereof, generally utilize densely packaged or stacked banks of circuit modules. In general there are clock modules and processor element modules (PEM) of a computer. A typical PEM may include a liquid cooled heat sink or "cold plate" sandwiched between a pair of printed circuit boards carrying thereon a number of circuit, logic and memory devices including numerous integrated circuits. If the computer has an air cooling system, a typical PEM has only one of such printed circuit boards mounted adjacent an air cooled cold plate. A typical clock module includes only one printed circuit board and may be mounted to either an air or liquid cooled cold plate. In computer designs of this type, such as the Cray Research, Inc. C-90 model, the integrated circuits are mounted on the exposed surfaces of each circuit board having both the electrical connections and the thermal path for cooling coming off the bottom of the package. Heat generated by the integrated circuits and other elements is dissipated through the bottom of each element, through the printed circuit board, and finally to the cold plate.

Integrated circuits of this type are usually provided in packages uniquely designed for a particular computer application and hence identified as custom packages. As technology continues to advance, computers are becoming much more complex with ever increasing capabilities and becoming increasingly faster and smaller with more densely packaged electronic devices and components. It is desirable to continue to reduce the size and increase the speed of computer components. The higher speeds and smaller, more densely packed components, however, result in much higher power dissipation and thus higher generation of waste heat. Excess heat build-up within a computer causes malfunction and failure of components such as the integrated circuits. The use of custom packages is a way to address the unique cooling problems associated with any particular computer design.

Today's competitive marketplace, however, has necessitated the use of standardized components to reduce manufacturing and production costs. Standardizing components helps achieve this goal by simplifying assembly procedures and reducing the number of parts and component variations. To eliminate the need to use custom packages, integrated circuits can be placed in standard "off the shelf" packages available from many package manufacturers. Standard packages are different than custom packages in that they typically have electrical connections off the bottom surface of the integrated circuits and cooling off the top.

Adequate cooling of the standard integrated circuit packages is critical but may vary from computer design to computer design. To provide better cooling, standard packages may be mounted to the circuit board between the board and the cold plate with the top of each package facing the cold plate. This construction more effectively and efficiently dissipates waste heat generated by the standard packages to improve computer operation and durability.

Mounting the standard integrated circuit packages on the bottom of a printed circuit board has created a whole new set of problems. One problem associated with using standard packages is the variability of the spacing or gap between the printed circuit board and cold plate caused by the dimensional tolerances associated with the various components of the package. It is desirable for standard packages to intimately contact the cold plate with no air gap between the two through a direct heat conductive path. This is difficult to accomplish since a board assembly usually incorporates more than one type of standard integrated circuit package with each type having different heights.

Additionally, the height variation from one standard package to another of the same type is dependent on the height of each individual subcomponent of the package, each of which varies in height within its own dimensional tolerance limits. It is necessary for proper heat dissipation that the integrated circuits have a direct thermal conductive path to the cold plate. To accommodate the height differences between different standard package types, a pedestal or bump may be formed on the cold plate at each location where the shorter elements of the circuit board will confront. The bumps have dimensional tolerance variations of their own so they alone are not sufficient to completely eliminate the gaps.

What is needed is a method and apparatus for cooling high power integrated circuits mounted on the bottom of a printed circuit board which provides a direct heat conductive path by eliminating the gap between the integrated circuits and a cold plate caused by dimensional tolerance variations. What is also needed is a method and apparatus which achieves such a result in conjunction with use of standard integrated circuit packages. What is further needed is a method and apparatus for cooling standard integrated circuit packages used on either air or liquid cooled PEM applications. What is still further needed is a method and apparatus which permits repairing or replacing an individual standard package mounted to a printed circuit board while consistently producing a direct thermal conductive path from the circuit to the cold plate without having to re-evaluate the tolerance stack up of each component of the module.

SUMMARY OF THE INVENTION

The present invention is for a method and apparatus for consistently providing adequate waste heat dissipation to a cold plate for a plurality of electronic components mounted on the bottom of a circuit board. The invention is effective in eliminating spacial gaps between a cold plate and standard integrated circuit packages providing a direct heat conductive path from the circuit package to the cold plate.

At least one printed circuit board assembly is provided having a printed circuit board which carries a plurality of electronic elements including various types of high performance integrated circuit standard packages on a bottom surface of the board. A cold plate is produced and is adapted to have one or more of the printed circuit board assemblies mounted thereon with the electronic elements sandwiched between the cold plate and the board. The gap that would result between the electronic components and the cold plate when assembled is determined for each component prior to assembly of the module. A plurality of, compressible, thermal shims are provided in a variety of predetermined thicknesses constructed from a highly thermally conductive material. One of the shims is selected for each of the gaps wherein the thickness of each shim, when compressed, is sufficient to eliminate the gap for which it is selected. Each shim is then positioned such that it is sandwiched between the cold plate and the appropriate electronic component upon assembly of the printed circuit board to the cold plate.

The present invention accommodates the height tolerance variation between high power integrated circuits of the same type. The invention also provides a direct heat conductive path from the electronic components to the cold plate to adequately dissipate waste heat generated by the components. Additionally, the invention permits use of standard integrated circuit packages within computer modules of any number of designs and configurations for both air and liquid cooled computer applications. Also, the invention aids in repair or replacement of individual electronic components by providing a simple way to achieve a proper heat conductive path from the new component to the cold plate.

DESCRIPTION OF THE PREFERRED EMBODIMENT

In the following detailed description of the preferred embodiments, reference is made to the accompanying drawings which form a part hereof, and in which are shown by way of illustration specific embodiments in which the invention may be practiced. It is to be understood that other embodiments may be utilized and structural changes may be made without departing from the scope of the present invention.

Figure 1:
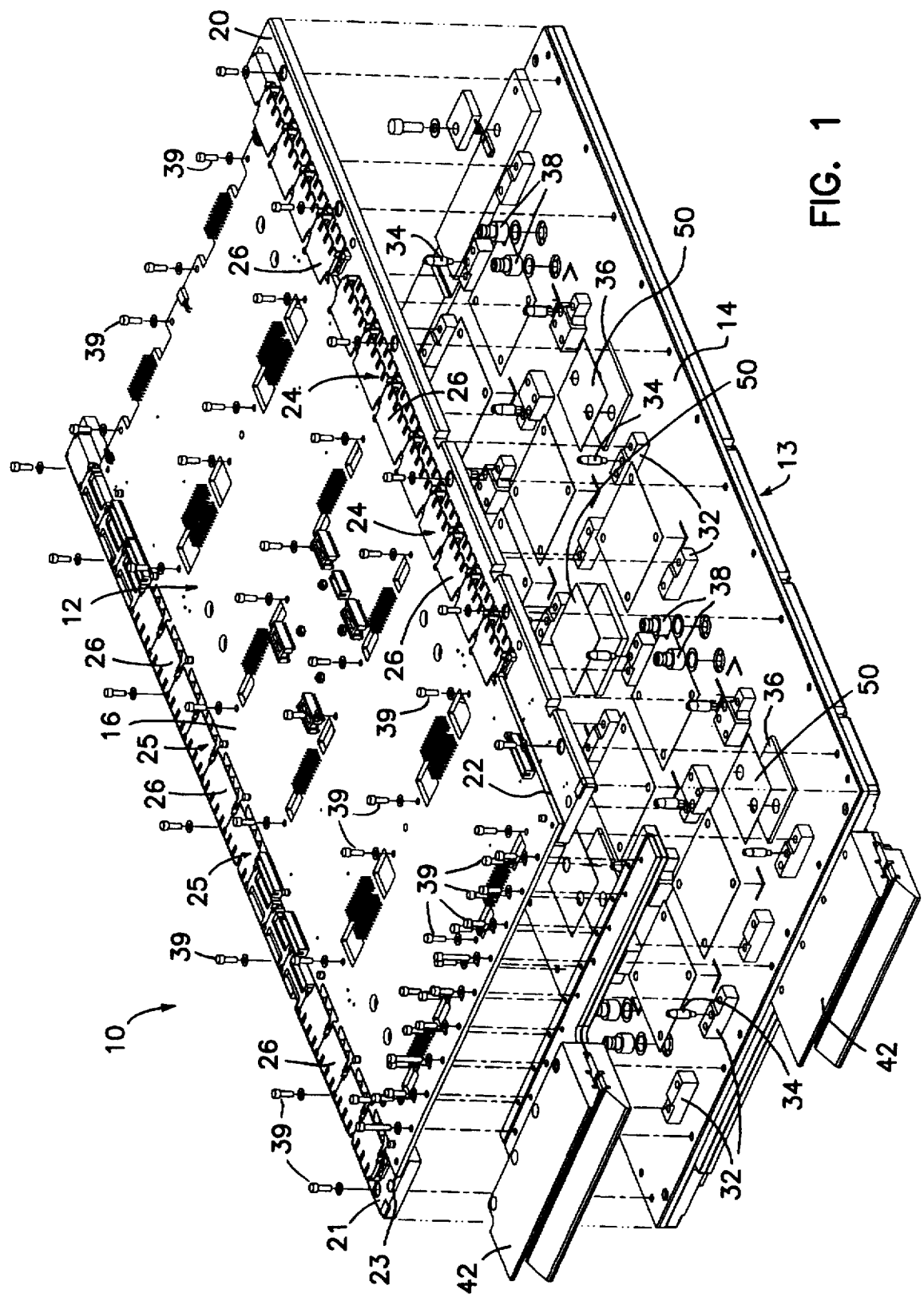
FIG. 1 is a partially exploded perspective view of a computer PEM constructed in accordance with the present invention including a liquid cooled cold plate.
Figure 2:
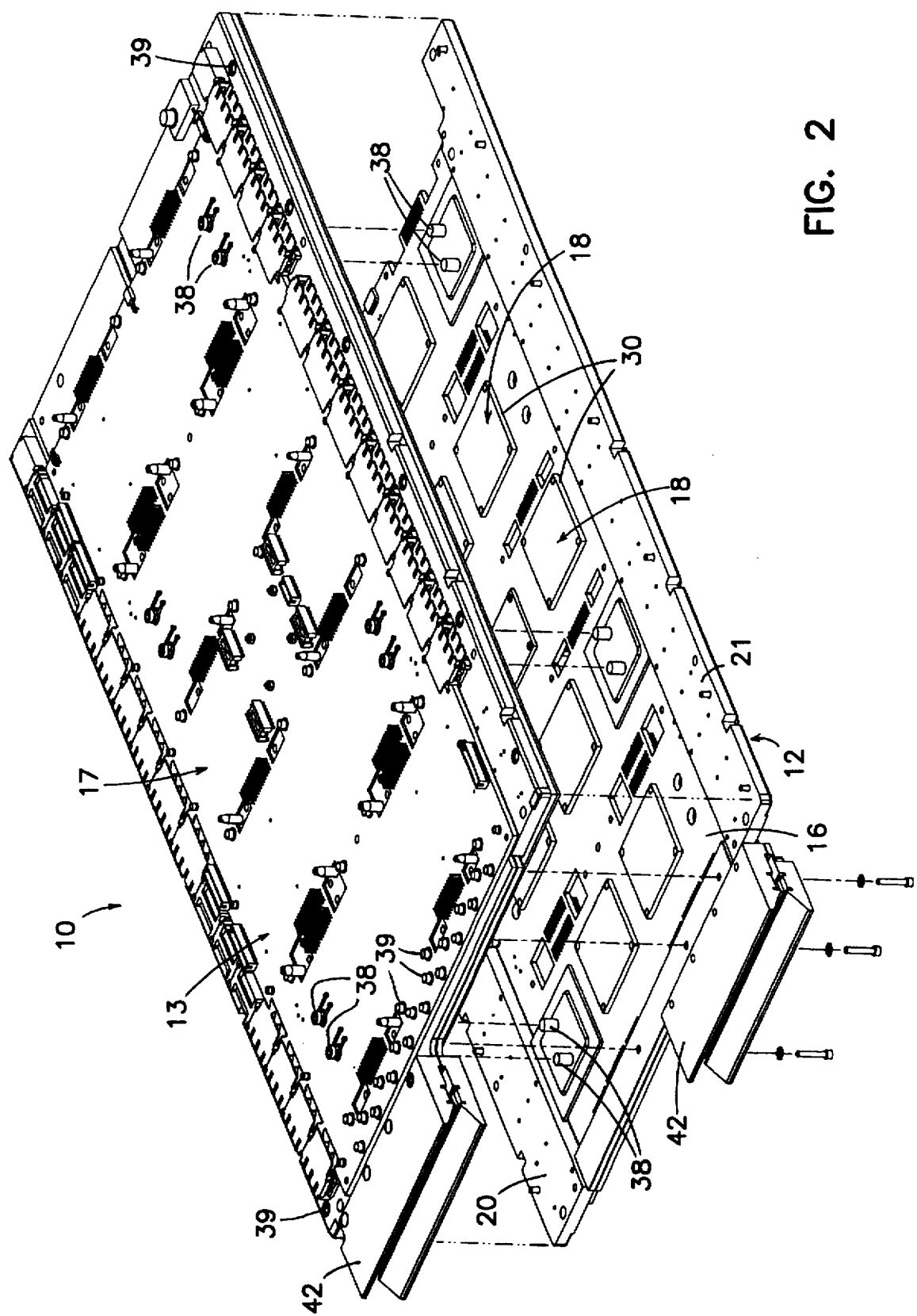
FIG. 2 is a perspective view of the partially exploded circuit module of FIG. 1 rotated 180° on the longitudinal horizontal axis.

Referring now to the drawings, FIGS. 1 and 2 illustrate a computer processor element module 10 (PEM) in a partially exploded view having a pair of printed circuit board assemblies 12 and 13 constructed in accordance with the present invention mounted to a liquid cooled cold plate 14 of a typical construction. Each printed circuit board assembly 12 and 13 includes a printed circuit board 16 and 17, respectively, carrying thereon electronic devices and components including a plurality of high performance standard integrated circuit packages 18. The devices, components and circuits are electrically connected in accordance with conventional printed circuit board assembly techniques. Cold plate 14 is intended to dissipate waste heat generated by the electronic devices and components during operation of the computer.

Damage to the edge connector assemblies during repair of individual integrated circuits is another problem associated with mounting integrated circuits on the bottom of a printed circuit board. The mounting rail and edge connector arrangement described below addresses the problem and is disclosed in co-pending U.S. patent application Ser. No. 08/605,356, filed herewith and assigned to the assignee of the present invention. The description of the mounting rail and edge connector arrangement therein is incorporated herein by reference. In one embodiment, a pair of connector mounting rails 20, 21 are attached to each circuit board 16 on opposite edges 22, 23 thereof, respectively. A pair of edge connector assemblies 24, 25 are mounted on each board assembly 12 for conductively connecting circuit board 16 to other printed circuit boards and components of the computer. Each connector assembly 24, 25 has a plurality of female blocks 26 carried on mounting rails 20, 21 for receiving therein a series of male connector pins (not shown) which are conductively received in stationary connector blocks carried on the computer side panels (not shown).

FIGS. 1 and 2 illustrate a typical construction of a computer PEM or circuit module 10. It is common for cold plate 14 to be sandwiched between a pair of printed circuit board assemblies 12 and 13 to form module 10. For simplicity of illustration and description, the invention will be described herein referring to only printed circuit board assembly 12 with the intention that the present invention be applicable to printed circuit board assembly 13 as well.

Figure 3:
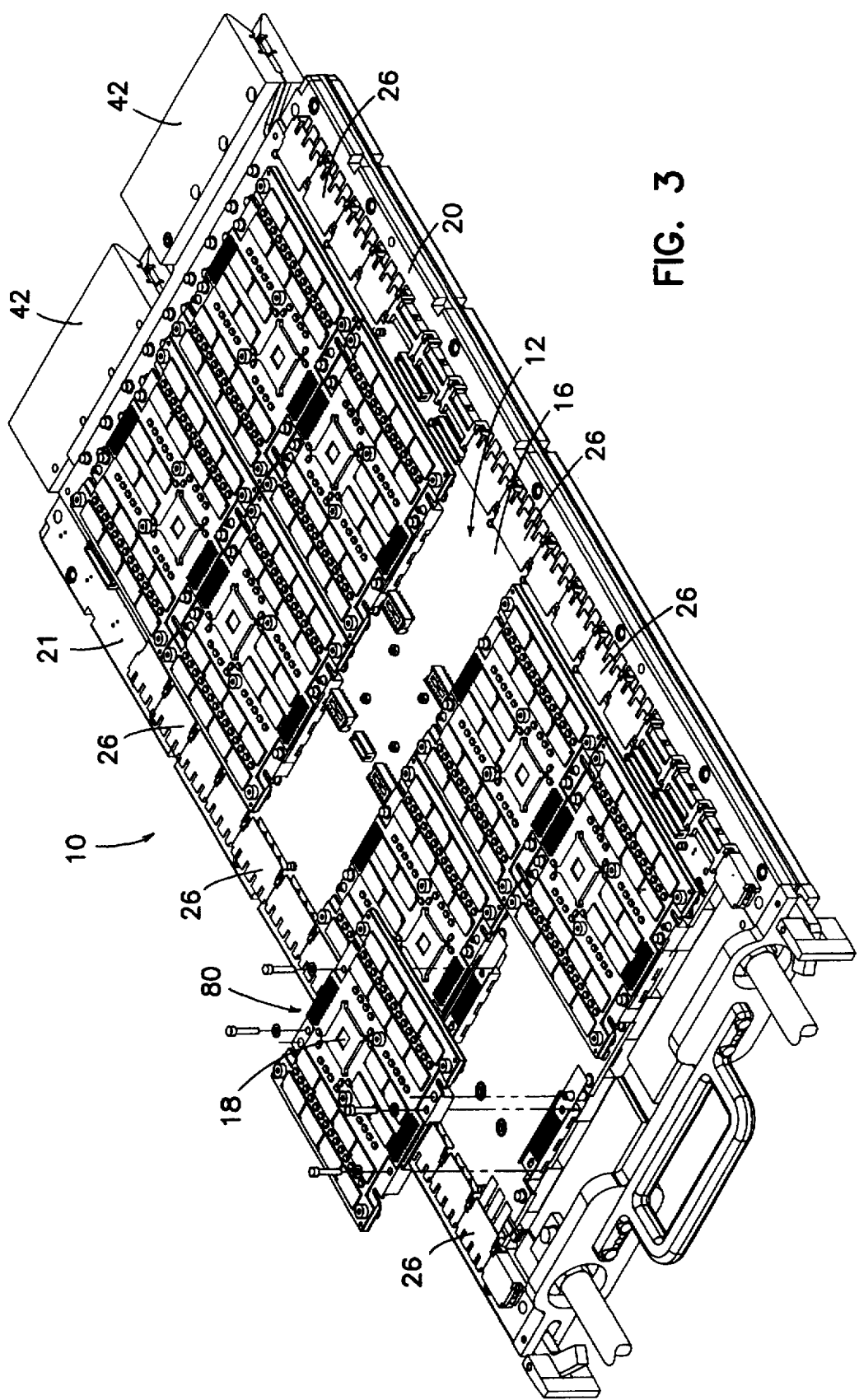
FIG. 3 is a perspective view of the circuit module of FIG. 1 rotated 180° on the vertical axis and having daughter cards assembled thereto.

As shown in FIG. 2, standard integrated circuit packages 18 and 19 are mounted to the bottom of printed circuit board 16 and will be sandwiched between the circuit board and cold plate 14 when assembled into circuit module 10. There are several different types of standard circuit packages 18 which are available such as ceramic column grid array (CCGA) or pin grid array (PGA). An additional type of package 18 is tape automated bond (TAB) package such as is shown in FIG. 3. Each type of package may have a different height and more than one type may be used on any given circuit board assembly.

In one embodiment, a standard TAB package 18 may include a cooling cap 30 as its outer most surface, the details of which are described in co-pending U.S. patent application Ser. No. 08/604,918, filed herewith and assigned to the Assignee of the present invention. The description of the cooling cap therein is incorporated herein by reference. Without solving the problems addressed by the present invention, cooling cap 30 of TAB package 18 provides improved conductive cooling capacity for the smaller and hotter running TAB type integrated circuit.

Figure 8:
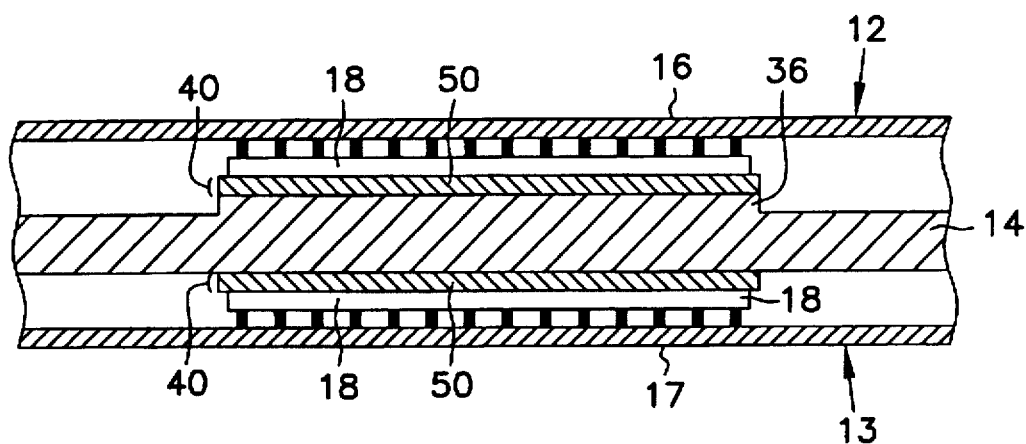
FIG. 8 is a side schematic view of the PEM of FIG. 1 illustrating two constructions utilizing the method of the invention.

As can be seen in FIGS. 1 and 2, a series of spacers 32, alignment pins 34, circuit pedestals or bumps 36, and processor element pull down pins 38 are also sandwiched between the circuit board 16 and cold plate 14. Spacers 32 are of a predetermined height and intended to spatially align cold plate 14 and board assembly 12 so that all circuit packages 18 have an adequate clearance or gap 40, as best illustrated in FIG. 8, between each package and the cold plate. Spacers 32 therefore must provide clearance for the tallest of standard packages 18 leaving a larger gap between the shorter packages and cold plate 14. The height of spacers 32 must account for the maximum height dimension within tolerance limits for even the tallest of the circuits. Therefore a gap may exist for even some of the tallest components.

Bumps 36 are integrally formed on cold plate 14 and intended to eliminate most of the gap 40 for the shorter packages. A pair of power connectors 42 are assembled to module 10 for providing mechanical and electrical connection to the power supplies for each board assembly 12 and 13 and module 10.

It is necessary that high performance standard packages 18 are in intimate or direct contact with cold plate 14 to provide adequate cooling for the integrated circuits of the package. Processor element pull down pins 38 and screws 39 are positioned and constructed to pull board assembly 12 and cold plate 14 together during assembly of module 10 to insure such intimate contact. Merely screwing the two components together is not always sufficient for liquid cooled PEM's because the liquid cooled cold plate is not very thick and another board assembly 13 is mounted on the opposite side of the cold plate.

Though it is desirable to have intimate contact between packages 18 and cold plate 14, it is undesirable to apply a severe compressive force on the standard packages. It is equally undesirable to apply bending and torsional stress to circuit board assembly 12 which could otherwise cause malfunction or failure of the components. Each standard package 18 of the same type has inherent dimensional variation or tolerance characteristics causing part to part size variations. The size of gap 40 between cold plate 14 and printed circuit board assembly 12 will vary according to the thickness and/or surface flatness of at least printed circuit board 16, mounting rails 20 and 21, cold plate 14, bumps 36, spacers 32, and assembled standard packages 18.

As circuit module 10 is assembled, each gap 40 will vary within a range which is determined by the tolerance stack up of each of the individual components effecting the particular gap. In order to insure that there is precise intimate contact between each of standard packages 18 and cold plate 14, spacers 32 not only must be designed to accommodate the tallest component on board assembly 12, they must be designed taking into consideration the worst case tolerance scenario. Hence, when module 10 is assembled, gap 40 will vary even as to standard packages 18 of the same type. The method of the invention solves this problem and insures intimate contact between cold plate 14 and each circuit package 18 therefore insuring adequate cooling of each.

According to one embodiment of the method of the invention, a series of thermal conductor shims 50 are provided. One shim 50 is selected and then positioned between each standard package 18 and cold plate 14 to fill each gap 40 therebetween. Thermal shims 50 are preferably manufactured from a material which has significantly high thermal conductivity and is somewhat compliant meaning the shim may be compressed slightly without inhibiting or affecting its thermal conductivity. However, because gap 40 varies based on the tolerance stack up of a number of components, the series of shims are produced in incremental varying thicknesses.

As an illustrative example of the present invention, the series of thermal shims 50 are produced having thicknesses which vary over a range of about 0.010 inches to about 0.040 inches and in increasing increments of 0.005 inches. The shim material must be compliant enough to adequately conduct thermal energy when compressed in thickness from between zero to about 0.005 inches. When module 10 is assembled and pull down pins 38 are set, it is preferred that each gap 40 is completely eliminated and each shim 50 completely contacts cold plate 14 and standard packages 18 over its entire surface area. As will be evident to one of ordinary skill in the art, any number of shim size ranges and thickness increments may be incorporated without departing from the scope of the present invention.

It is preferable that the thickness of a particular shim 50 of the series is easily and readily identifiable so that an operator may consistently and accurately select the proper shim for a particular gap 40. Any number of identification means may be used without departing from the scope of the present invention such as by marking actual thickness on each shim, or by some series of names or numbers, or by a series of shapes. The preferred method of identifying a particular shim is by using a color coding system. Each group of shims 50 of the same thickness is preferably fabricated having an easily identifiable color unique to that shim thickness.

Cold plate 14 and printed circuit board 12 of circuit module 10 are measured at critical points to determine the gap between each standard package 18 and cold plate 14. Since both the cold plate 14 and printed circuit board 16 will have a thickness that varies over its relatively large surface area, it is preferred that the subassemblies first be constructed. Thus, individual components mounted to circuit board 16 are preferably preassembled into circuit board assembly 12 including standard packages 18 and mounting rails 20, 21. Spacers 32 and bumps 36 are preferably formed integral with cold plate 14 but if not, they are preferably mounted to cold plate 14 prior to making any measurements.

Circuit board assembly 12 is then placed in a fixture having a structure constructed to simulate assembly into circuit module 10 for the purpose of determining the appropriate height dimension or board measurement of each standard package 18. Additionally, cold plate 14 is mounted in another structure fabricated for simulating module installation and precisely determining the dimension or plate measurement at each point where a standard package 18 will confront the plate when module 10 is assembled. For precise measurement of the required dimensions, it is preferred that the measuring process of the fixture be automated so that each and every necessary dimension is measured repeatedly and accurately to determine the average height dimension at each critical point.

Figure 6:
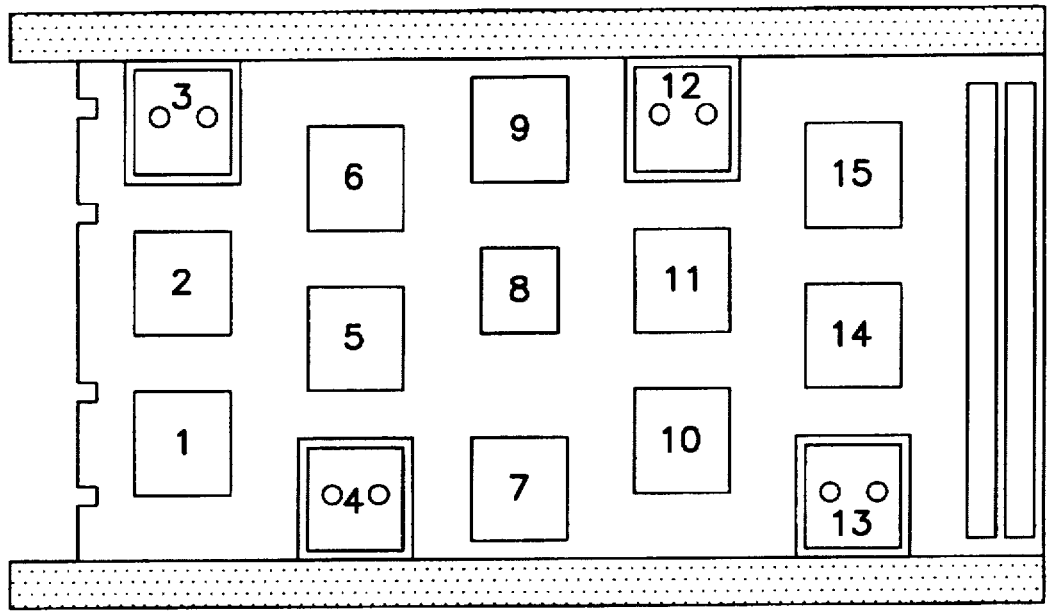
FIG. 6 is a schematic view of a printed circuit board assembly indicating by number the locations for a plurality of electronic components mounted thereon.
Figure 7:
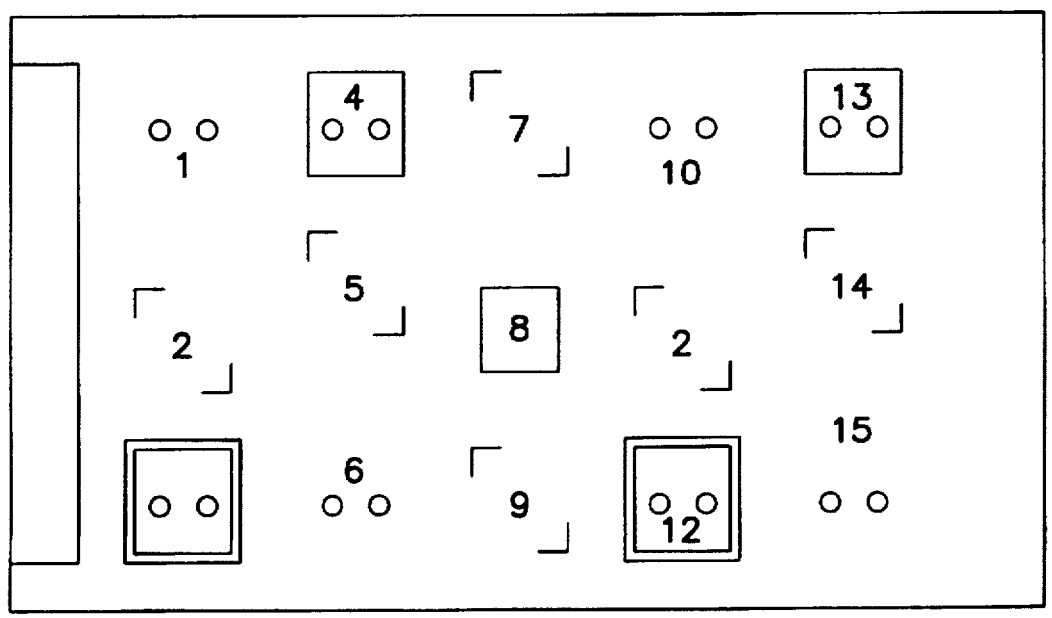
FIG. 7 is a schematic view of a cold plate assembly indicating by number the corresponding mating locations for the electronic components of FIG. 6.

As schematically illustrated in FIGS. 6 and 7 for example, each board measurement taken from printed circuit board assembly 12 has a corresponding plate measurement taken from cold plate 14 which when compared will yield each gap 40 between the cold plate and each standard package 18. For illustrative purposes, if the particular module 10 is to include fifteen standard packages, the measurements for each standard package are given a number from one to fifteen. A module assembly operator may then select from the various thermal shims 50 the proper thickness of shim for each gap 40 determined for locations one through fifteen.

Preferably, one side of each thermal shim 50 has an adhesive layer or film thereon for attaching the shims to cold plate 14 at each location that will confront a standard package 18 mounted on printed circuit board assembly 12. To facilitate disassembly and repair of individual high performance standard packages 18, thermal shims 50 are not adhered directly to the top of each package. Removing a thermal shim 50 which is partially or completely adhered to a standard package 18 may damage or destroy the integrated circuit package whereas it is much easier to remove a thermal shim from cold plate 14 without damaging any computer component. Additionally, circuit packages 18 get very hot while the computer into which they are installed is running. Such an application of shims 40 would require a higher quality, more expensive adhesive.

To simplify initial assembly and to facilitate disassembly and repair of circuit module 10 it is desirable that the automated gap measuring system produce a recorded output or printout of each measurement and its corresponding location (one through 15 in the example) for both the printed circuit board 12 and cold plate 14 subassemblies. As in the example, a circuit module may include fifteen standard packages carried on each printed circuit board assembly and have fifteen corresponding locations on one side of cold plate 14. The printout preferably includes a number for each location from one to fifteen, a corresponding board measurement, a corresponding plate measurement, and a gap measurement for each expected gap 40 at each location. During initial assembly, a module assembly operator refers to the printout, determines each gap 40 for a given location, selects the appropriate color shim 50 corresponding to each expected gap, and adheres the thermal shim to cold plate 14 at the given location.

Figure 9:
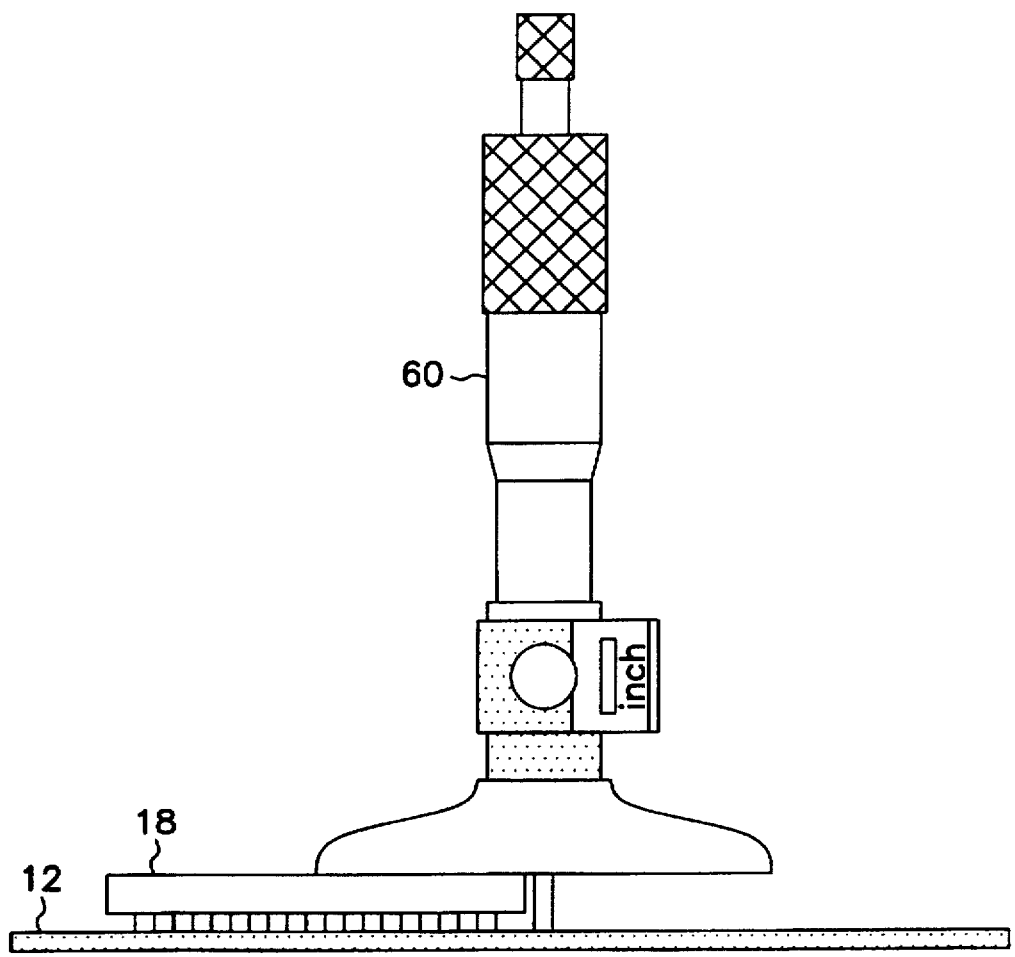
FIG. 9 is a partial side view of an integrated circuit package mounted on a printed circuit board being serviced.

For replacement and repair, an operator disassembles circuit module 10 and removes the suspect standard package 18 from circuit board 12. The operator then reinstalls the new or repaired component and remeasures, as shown in FIG. 9, the height dimension or board measurement of the newly installed component by hand with a highly accurate measuring tool such as a depth micrometer 60. The operator then refers to the original recorded printout for the corresponding cold plate dimension for that particular location, calculates the new gap 40, selects the appropriate shim 50, and adheres the shim to cold plate 14 at the given location.

Figure 4:
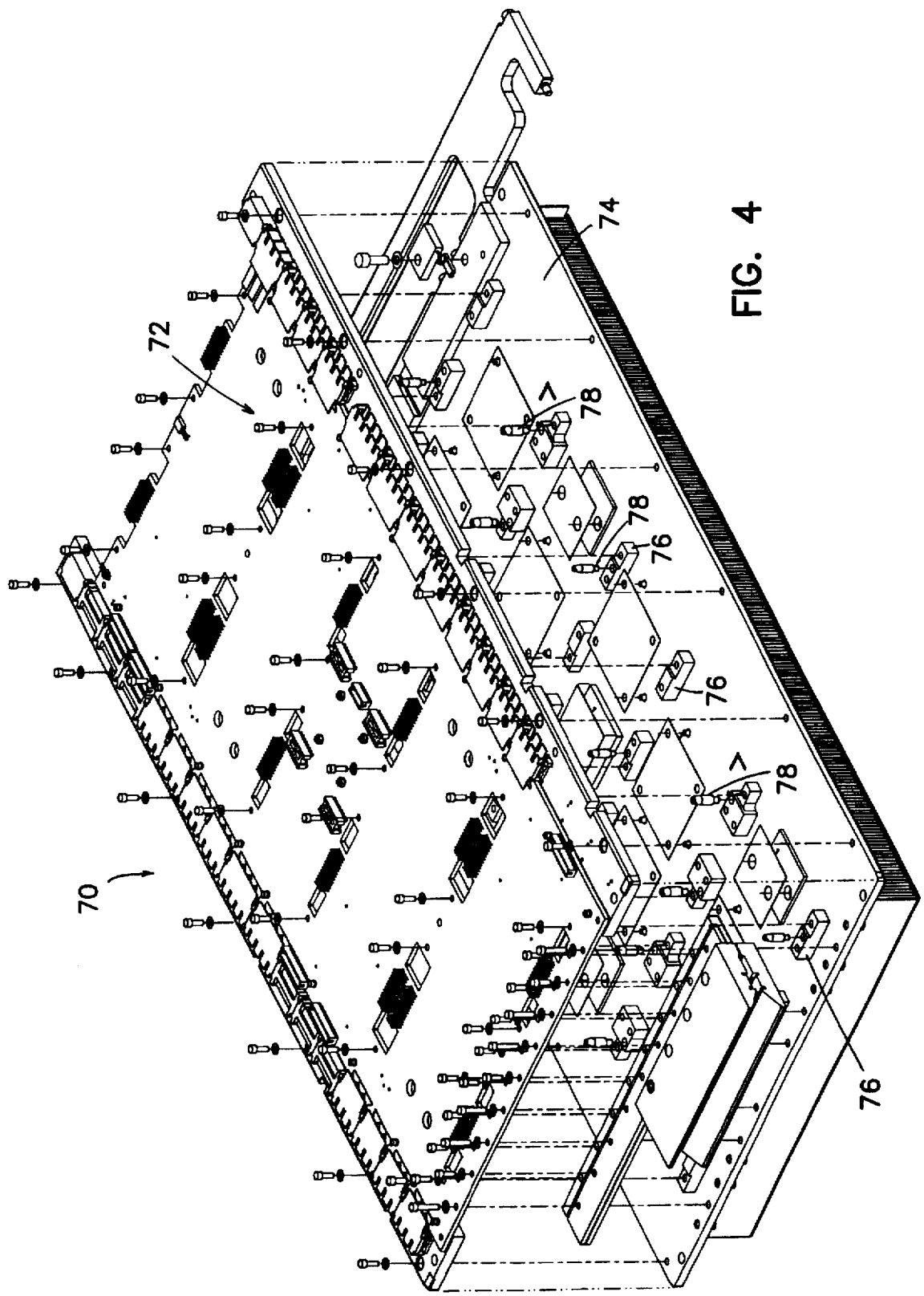
FIG. 4 is a partially exploded top perspective view of a computer PEM module of the invention including an air cooled cold plate.

In an alternative embodiment, FIG. 4 illustrates a partially exploded view of a computer 70 which is air cooled. A printed circuit board assembly 12 is mounted to an air cooled plate 74. Board assembly 12 is of essentially the same construction as board assemblies 12 and 13 described above and will not be described in detail here. Cold plate 74 carries thereon a plurality of spacers 76 serving the same function as spacers 32 described above. A typical PEM may be cooled by either a liquid cooled or air cooled cold plate depending on the cooling system of the particular computer into which module 70 will be installed. Air cooled cold plate 74 of this embodiment is illustrated to show the difference in construction from liquid cooled cold plate 14 of the prior embodiment. Only one printed circuit board assembly 12 is used when the module is air cooled. No pull down pins 38 described in the prior embodiment are necessary for an air cooled module. Since only one board assembly 12 is present, the board assembly may be screwed directly to the cold plate 74 without damaging any components.

Figure 5:
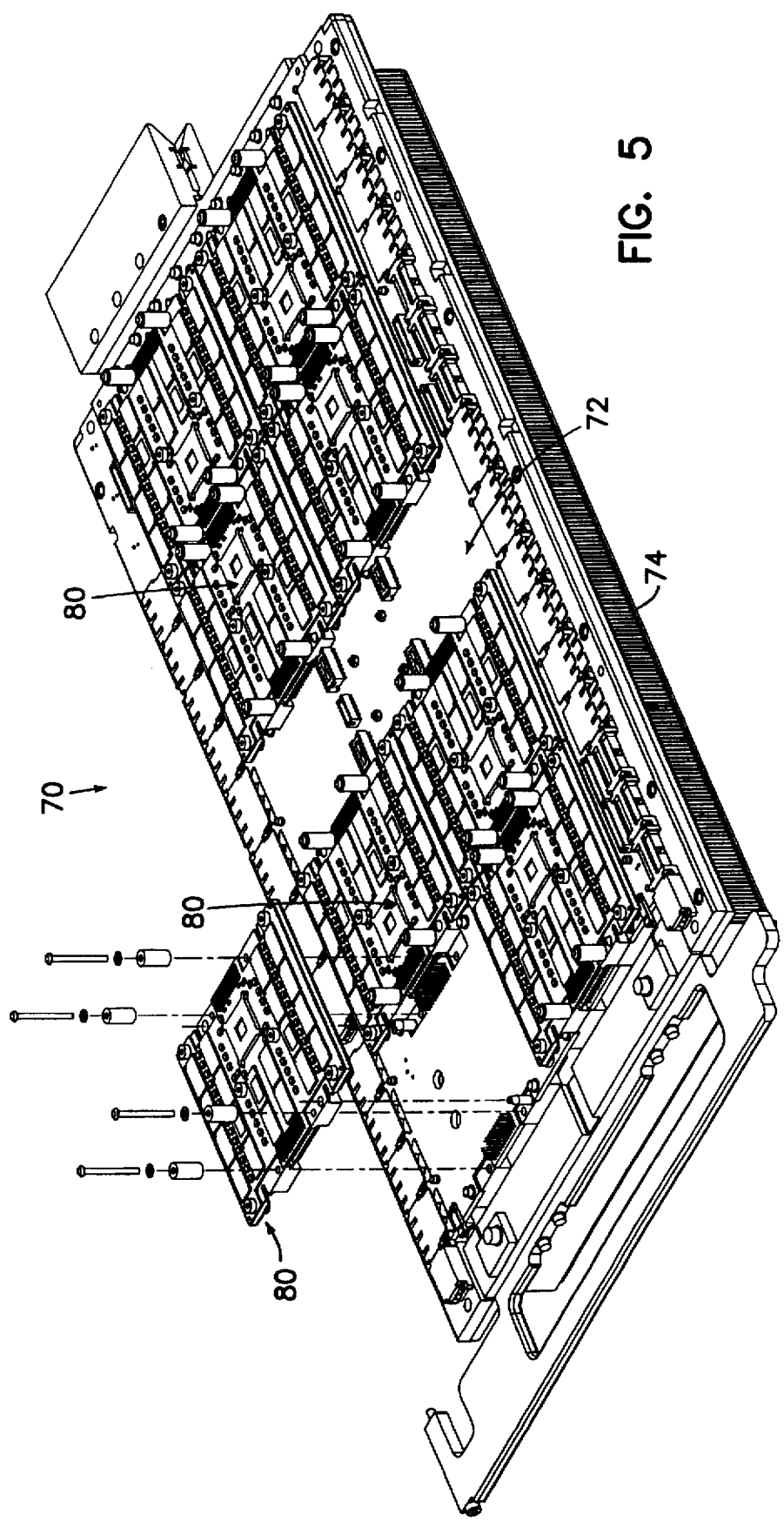
FIG. 5 is a perspective view of the circuit module of FIG. 4 rotated 180° on the vertical axis and having daughter cards assembled thereto.

As shown in FIGS. 3 and 5, to finish assembly of PEM 10 (FIG. 3) or PEM 70 (FIG. 5) a number of daughter card assemblies 80 are connected to the printed circuit board assemblies 12 and 13. Alignment pins 34 provide precise axial or horizontal alignment between PEM 10 and daughter cards 80, as shown in FIG. 3. Similarly, alignment pins 78 align daughter cards 80 with PEM 70, as shown in FIG. 5. Daughter cards 80 are preferably identical regardless of the cooling system and may be attached to either type of module. By utilizing standard integrated circuit packages, standard daughter cards and the cooling method of the invention, standardized processor element modules may be constructed and effectively used in place of custom designed modules.

It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A method of cooling a plurality of electronic elements including a first electronic element mounted on a printed circuit board assembly, the method comprising the steps of:
   providing a cold plate;
   providing a plurality of thermal shims of varying thicknesses, wherein each shim is formed from a thermally conductive, compressible, material;
   determining a first gap between said first electronic element and said cold plate, wherein said first gap would result were said printed circuit board assembly mounted adjacent said cold plate;
   selecting one of said shims to fill said first gap, wherein the step of selecting includes determining the shim with the thickness that, when compressed, best fills said first gap;
   mounting said printed circuit board to said cold plate, wherein the step of mounting includes the step of positioning the selected shim between said cold plate and said first electronic element.

2. The method of claim 1 wherein the step of providing a plurality of thermal shims includes the step of providing first and second groups of shims wherein said first group of shims each have approximately a first thickness and said second group of shims each have approximately a second thickness and wherein said first thickness is different from said second thickness.

3. The method of claim 2 wherein the step of providing said first and second groups further includes the step of forming said first group such that each thermal shim therein has a first color to identify thermal shims of said first thickness and forming said second group such that each thermal shim therein has a second color to identify thermal shims of said second thickness, and wherein said first color is different from said second color.

4. The method of claim 1 wherein the step of determining said first gap includes the step of placing said circuit board assembly in a fixture constructed and arranged to measure said circuit board assembly to obtain a first gap measurement associated with said first electronic element.

5. The method of claim 4 wherein the step of determining said first gap further includes the step of placing said cold plate in a fixture constructed and arranged to measure said cold plate to obtain a second gap measurement associated with said first electronic element, wherein a function of said first and second gap measurements is an approximate measure of said first gap.

6. The method of claim 1 wherein the step of providing a plurality of thermal shims includes the step of depositing an adhesive layer onto one side of each of said thermal shims.

7. The method of claim 6 wherein the step of positioning the selected shim includes the step of adhering the selected shim to said cold plate in an area where it will contact said first electronic element when said printed circuit board assembly is mounted to said cold plate.

8. A computer circuit module comprising:

a cold plate, a printed circuit board carrying thereon a plurality of electronic elements, including a first and a second electronic element, said circuit board being mounted adjacent said cold plate with said first and second electronic elements disposed therebetween, a thermally conductive, compressible, first shim disposed between said cold plate and said first electronic element, and a thermally conductive, compressible, second shim disposed between said cold plate and said second electronic element, wherein the first and second shims, when uncompressed, have different thicknesses.

* * * * *